United States Patent [19]

Basara et al.

[11] Patent Number: 5,216,579
[45] Date of Patent: Jun. 1, 1993

[54] RACK BASED PACKAGING SYSTEM FOR COMPUTERS WITH CABLE, COOLING AND POWER MANAGEMENT MODULE

[75] Inventors: Michael Basara, Milan, Italy; Collan B. Kneale, Ashville, N.C.; Samuel A. Lucente, Stamford, Conn.; John Natoli, Woodstock, N.Y.

[73] Assignee: International Business Machines Corporation, Armonk, N.Y.

[21] Appl. No.: 827,238

[22] Filed: Jan. 29, 1992

[51] Int. Cl.⁵ .................. H05K 7/20; H02B 1/20
[52] U.S. Cl. ......................... 361/383; 174/48; 361/428
[58] Field of Search ............ 165/104.33; 174/48, 174/49, 24, 33; 361/382, 379, 383–384, 390, 391, 428

[56] References Cited

U.S. PATENT DOCUMENTS

| | | | |
|---|---|---|---|
| 4,449,764 | 5/1984 | Hastings | 312/236 |
| 4,679,123 | 7/1987 | Young | 361/428 |
| 4,860,168 | 8/1989 | Wiljanen et al. | 361/428 |
| 4,866,575 | 9/1989 | Mickelson | 361/428 |
| 5,027,257 | 6/1991 | Lockwood et al. | 361/383 |

OTHER PUBLICATIONS

TDB, vol. 32, No. 4A, Sep. 1989 "Cable Management Assembly for Rack Mounted Equipment"/A. L. Hodges & M. J. Lawrence.
TDB, vol. 20, No. 7, Dec. 1977 "Modular Cable Distribution for Rack Mounted Equipment"/G. J. Battiloro and R. R. Trombly.
Axis article (no date).

Primary Examiner—Gregory D. Thompson
Attorney, Agent, or Firm—Mark S. Walker; William A. Kinnaman, Jr.

[57] ABSTRACT

An assembly of chases is disposed on the exterior of a rack supporting discrete computer, DASD, communications, storage and similar electronic modules to provide input/output cable management, cooling passages to supply cooling air to each of the electronic units and a power distribution chase to manage the power distribution to the separate electronic modules. The cable management chase provides efficient storage of excess cable length to improve appearance and efficiency of electronic module installation.

9 Claims, 4 Drawing Sheets

RACK BASED PACKAGING SYSTEM FOR COMPUTERS WITH CABLE, COOLING AND POWER MANAGEMENT MODULE

FIELD OF THE INVENTION

This invention relates to cabinets and enclosures for computers and the management of the signal cables, power cabling, and cooling utilized with the computer.

BACKGROUND OF THE INVENTION

As computers have become smaller and smaller with time and as system integration increases the need for interconnecting all kinds of computers and related electronic modules is more complicated. The technology to interconnect different portions of the computers and connecting the computers to networks and non-resident terminals has not kept pace in terms of reduction in size or miniaturization of the electronics and improved density. Cables are substantially identical in size to the cables that have been used in the past; accordingly, as the computers are reduced in size, the same number, or in some cases, significantly larger numbers of interconnection cables and input/output cables must now connect to and terminate at a considerable smaller device.

Communication modules are also now associated with and become part of a computer system, and the communications modules interface with a very large number of input and output cables.

Other examples of modules which require cable connections either among themselves or to the computer are: DASD units, processors, communication, switch, input/output, storage cooling and power supply units.

In addition to the interconnection of the power supply unit output cables with the computer, DASD units, communication modules and other electronic modules associated with the overall computer system, the utility power cables for the power supplies typically must be managed so as to be neatly arranged while not becoming a safety hazard. Typically, power cords or cables for computer and related modules exit from the rear of the device and must be managed at the rear of the cabinet.

A need exists to route the power cables to power outlets. Heretofore, power outlets have been installed in the wall or the floor, or close by in a separate power outlet panel. In those instances where the floor is a raised variety, the power cables are managed by running the power cables down through an opening in the floor, permitting the plugging of the power cables into power outlets underneath the raised floor.

With respect to cooling needs, computers, other electronic modules including direct access storage disk units (DASD units) and other electronic modules, enumerated above, mounted in the same cabinet, all generate heat and all must be effectively cooled in order to preserve the proper operation and reliability of the overall system. Typically, each separate unit has a cooling fan which pulls cooling air either through an entrance port located near the front of the electronic module or into the module from the sides if there are no or limited side panels on the housing or no grills on the front panel. The most prevalent arrangement is to pull the air generally from the front of the electronic module to the rear and exhaust the cooling air through the exhaust fan into the ambient environment. Some modules develop only a small amount of heat and, accordingly, can be adequately cooled using ambient room air as the cooling medium. However, there are larger consumers of electrical power which demand more with respect to thermal requirements. The modules will generate sufficient heat that the cooling air supplied to the modules must be refrigerated or chilled substantially below room temperature in order to adequately cool the electronics.

When chilled or colder air is required, it is necessary to run cooling ducts from an air conditioning or refrigeration chiller so that the air may be directed from the device cooling the air to the electronic modules requiring the cold air.

In many cases, this is accomplished by the routing of the cool air under a raised floor and delivering the cool air to the bottom of the electronic assembly requiring the air.

In such cases where the cooled air is delivered to the bottom of the assembly, it is necessary to rely on air flow upward through the assemblies to the uppermost units. Cooling fans are used to deliver sufficient volumes of cooled air to regions requiring cooling.

Electronic modules, such as computers, disk drives, communication switching units and the like, enumerated above, usually have connections for both input and output data cables, on the front or the rear of the electronic units.

Seldom does an opportunity exists to manage both the organization and appearance of the cables used to interconnect different devices within a single cabinet or in adjacent racks and to interconnect the devices with other devices remote therefrom. This is particularly true when dealing with communication modules where cable input from a large number of different origins come together and terminate at the module.

As the number of cables increases, the cables hang off the electronic module, typically presenting a very disorganized, pool appearing arrangement which is difficult to service. The cables themselves are also subject to being changed. With the increasingly common usage of fiber-optics for the transmission of data and communications, the fiber-optic cables must be handled, positioned and stored in a manner which will prevent the glass fibers contained therein from breaking.

OBJECTS OF THE INVENTION

It is an object of the invention to efficiently route cables between electronic modules and other destinations.

It is another object of the invention to permit ready access to the cables for servicing.

It is still another object of the invention to provide enhanced cable management without incurring undue time requirements for installation or services.

It is a further object of the invention to route the cables in such a manner as to prevent damage to the cables.

It is a still further object of the invention to ease installation and removal of rack mounted electronic modules.

It is an additional object of the invention to efficiently transport cooling air to the electronic modules.

It is still an additional object of the invention to route utility power to the proximity of the power cord of the electronic module.

SUMMARY OF THE INVENTION

These and other objects of the present invention are obtained by attaching vertical chases or plenums to the side of a 19 inch EIA frame. Many computers are assembled and packaged in such a way that they are built up out of modules which are then placed into and attached to an EIA frame. The EIA frame is typically 19 inches wide at the front opening, and of varying depths including any cover panels. This arrangement is applicable to racks of other dimensions or proportions.

The openings are designed to admit electronic units inserted therein. The electronic modules or units are then connected to each other or to incoming and outgoing cables which are mounted on the rack or frame. The electronic modules may be front or rear cabled, but generally are not cabled or both surfaces for the same unit.

The vertical chases mounted on the side, front or rear of the rack serve to form one exterior wall of the overall assembly. The chases comprise separate plenums or chases to serve three separate functions. Typically, the chase located closest to the front face of the electronic module, from which the cabling will exit, will be the cable chase; the other two chases or plenums serve as ventilation air and power distribution chases. If the cabling predominantly resides at the front face of the electronic modules, then the frontmost chase typically will be the cable chase and typically will extend forwardly from the front of the rack a short distance, thus presenting a side surface of the chase for ingress and egress of the cables to and from the plenum.

Typically, the power cords for electronic modules such as the computer units, processors, DASD units and others enumerated above, extend from the rear surface or rear face of the electronic module and, accordingly, the rearmost chase will be the power distribution chase.

This may be altered in any case where there is substantial rear cabling of the electronic modules, providing flexibility of design. The power distribution chase is an open plenum with electrical outlet boxes mounted in at least one walls. The outlet boxes may be of either a conventional or dedicated design mounted at points distributed along the height of the wall of the chase. With the power outlet boxes being in very close proximity to the face of the electronic module having the power cord, there is the desirable benefit of shorter power cords and the elimination of disorganized power cords hanging off the back of the assembly creating a safety hazard as well as the risk of accidental disconnection. The power distribution chase could include safety features such as an emergency power-off control.

The power outlets on the wall of the power chase may be left exposed, or there may be a door or cabinet closure which may be mounted on the power chase to further close access to the power outlets and to improve appearance if desired.

Electronic modules of the nature described herein are typically cooled by a cooling fan mounted in the rear panel of the module and which pulls air from the front of the module to the rear of the module, thus the cooling air passes over the electronic components within the covers of the electronic module.

In some cases, there are specific cooling air inlets formed in the sides of the electronic module housing; in other instances, the cooling air is merely allowed to infiltrate into the housing at various openings and apertures inherent in the design of the device.

In either event, the third plenum may be connected to either a source of refrigerated or chilled air such as an air conditioning duct or to the ambient room air to provide an unimpeded air passage to the vicinity of each electronic module in the EIA rack. Where an electronic module is provided with a side access air entrance, the opening in the wall of the cooling air chase may be positioned proximate that opening to maximize the air flow delivery to the cooling entrance. If the module relies on air infiltration, the cooling air delivery opening may be disposed close to the side of the module to provide maximum cooling air availability near infiltration points.

With prior knowledge that the cooling air plenum typically will be the center plenum of the present invention, the air entrance points for the electronic modules may be located advantageously at a mid-range position front-to-rear on one or both sides of the electronic module housing and internal baffling advantageously used to direct the cooling air flow in the module.

In some cases, it might be desirable to route the heated or warmed air away from the electronic module assemblies; it might be desirable to reverse the air flow for cooling purposes, thus blowing air in through the back panel of the individual modules and collecting the warmed air in the plenum for transportation to some remote point.

Depending upon the efficiency of the air transportation means used to pull the warmed air out of the plenum, it is possible that the source of air movement could be adequate to move ambient room air through the device without an additional cooling fan assist.

The sides of the plenum assembly, in addition to creating unit integrity of the plenum assembly, may also provide the sides for the EIA rack, thereby eliminating the cost of additional siding material for the rack. The positioning of the openings in the cooling chase, and the positioning of the openings in the power chase may be pre-stamped for subsequent knock-out when assembled; or, depending upon the location desired, the openings may be custom cut at the time of assembly.

DETAILED DESCRIPTION OF THE PREFERRED EMBODIMENT OF THE BEST MODE OF CARRYING OUT THE INVENTION

Figure 1:
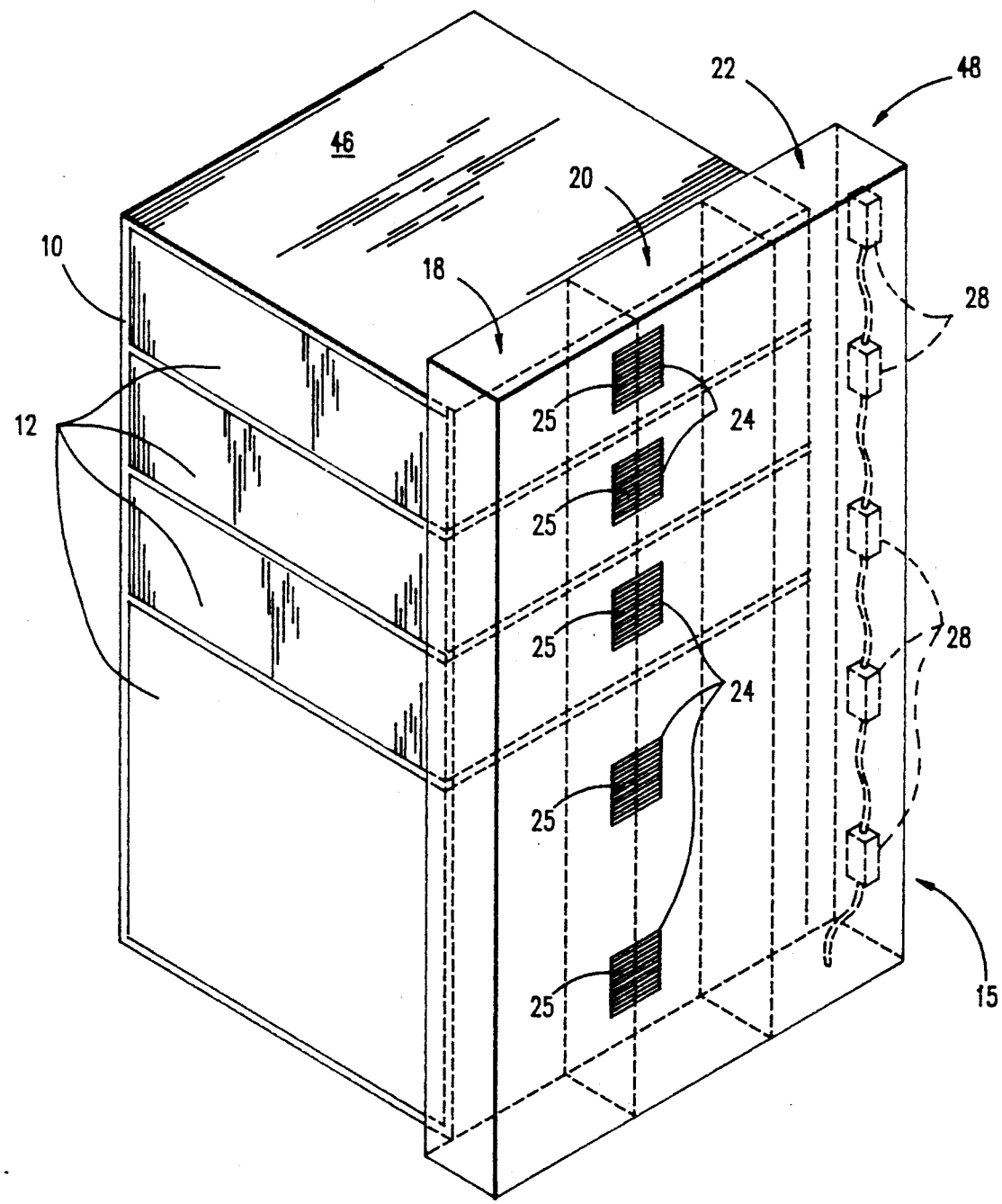
FIG. 1 is a perspective view of one EIA rack and cabinet with three plenums or chases attached to one side thereof.

With reference to FIG. 1, an EIA standard 19 inch frame 10 is shown with four electronic modules inserted into and mounted on the frame 10. Electronic modules 12, for example, may be central processing units, power supplies, DASD units, communication units or other similar type units which are combined to yield an overall computer system assembly. Each of the electronic modules 12 typically possesses its own cooling fan 16 mounted in its rear panel 17, better illustrated, in FIG. 5. Cooling fans 16 pull cooling air through the modules 12 and past the electronic components to keep the electrical components sufficiently cool to operate properly.

Referring back to FIG. 1, the plenum assembly 15 is positioned adjacent to EIA frame 10 and attached thereto thus forming one side of the cabinet 46 for the electronic modules 12 and frame 10. Plenum assembly 15 is typically comprised of three plenums, cable plenum or cable chase 18, cooling plenum or chase 20 and power plenum or chase 22. Cable chase 18 is preferably positioned such that it is closest to the face of the electronic modules 12 from which cabling will emanate and to which cabling will terminate.

In FIG. 1, it is assumed for purposes of description, that the front face of electronic modules 12 is the face that is referred to as the cabling face and thus, cable plenum 18 extends along the side of the frame 10 and projecting forwardly so that plenum 18 will present a partial side surface to that region immediately in front of frame 10. This permits the cabling 40 from modules 12 to be run laterally across the face of the modules 12 and to enter the side panel of plenum 18.

In order to provide cooling air flow to the respective modules 12, a cooling plenum 20 is disposed immediately behind cable plenum 18 and adjacent to the side of frame 10. Openings 24 in the side wall of plenum 20 provide a flow path for the cooling air contained within the plenum 20 and supplied through the plenum 20 to enter into the modules 12. The supply of cooling air may be from a duct not shown, from a chiller or refrigeration apparatus, connected either at the upper or lower end of the cooling plenum 20.

The opening 24 may be advantageously positioned to be close to an entrance cooling air intake grill 25 if such exists on the exterior housing of module 12.

If module 12 in fact has a side which is open, rather than a grill such as grill 25, then the opening 24 may just present an easy air flow into the overall volume of modules 12.

Rearwardly positioned from cooling plenum 20 is illustrated a power distribution plenum 22.

The power distribution plenum 22 provides a vertical chase through which utility power may be transmitted and distributed to power outlets 28. The positioning of power outlets 28 in close proximity to the back panel 17 of modules 12 is desirable so that exposed extended runs of power cabling are not required.

It should be understood also that in the event a stand-alone power supply is utilized within the rack system to power other modules with a non-utility power, the utility power for the power supply may be supplied through a portion of the plenum 22 while the output of the power supply would then re-enter or be connected to power distribution equipment within the plenum and be distributed to the other electronic modules as needed through power outlet connections in plenum 22.

Figure 2:
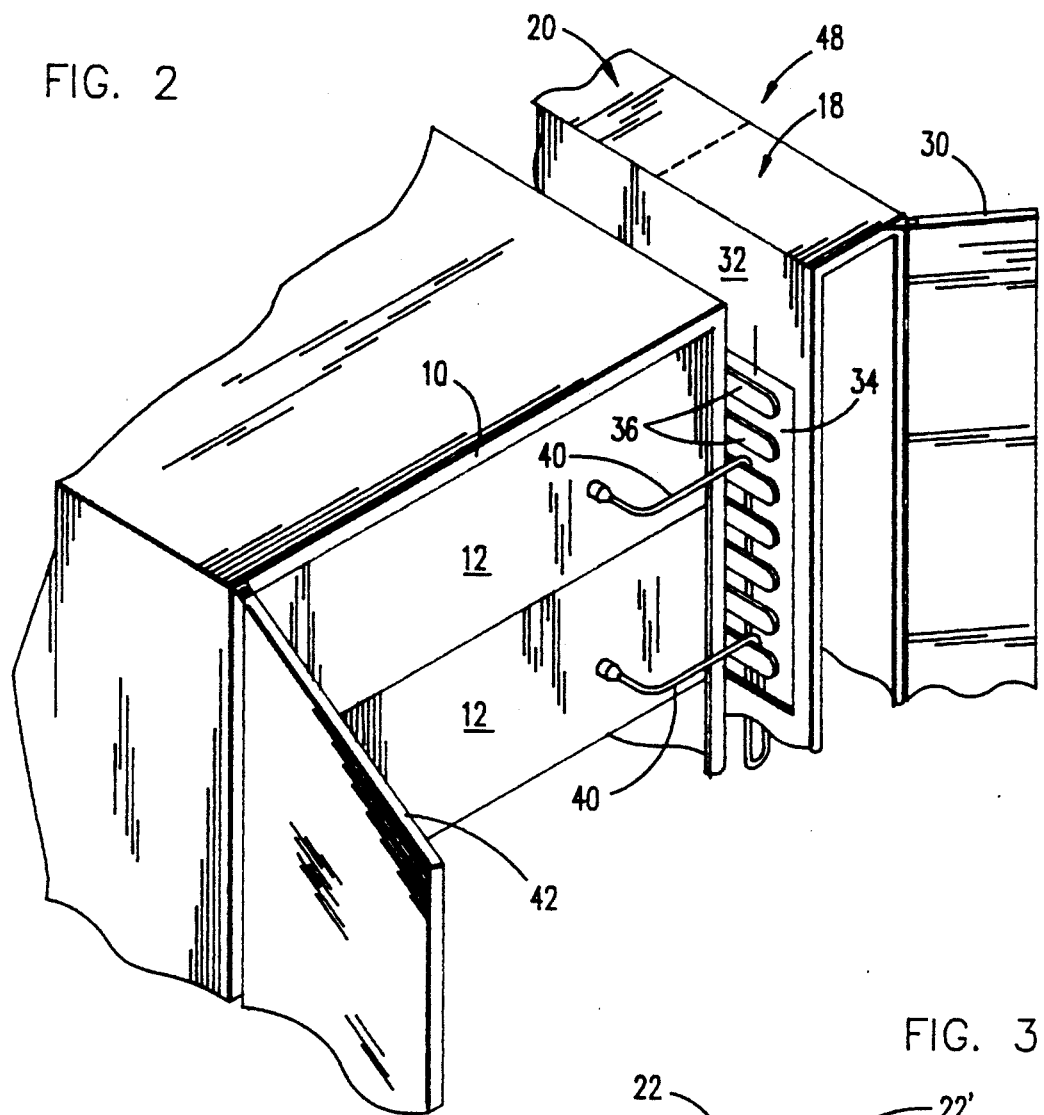
FIG. 2 is an enlarged detail of the preferred embodiment of the cable chase and the cable positioning comb.

Referring now to FIG. 2, only two electronic modules 12 are illustrated for the sake of clarity.

Cable plenum 18 is illustrated having front cabinet door 30 and a side panel 32. Side panel 32 is formed to provide an opening 34 disposed such that it leaves a plurality of fingers or teeth 36 in a comb type arrangement.

The openings 34 formed between the teeth 36 provide an accessibility to the interior of the plenum 18. Cable 40 is shown interconnecting the two electronic modules 12 with the excess portion of the cable hanging in a loop within plenum 18. By opening cabinet door 30, access to the cable 40 within plenum 18 is greatly eased and permits the orderly arrangement of the cable 40 within plenum 18, preventing damage to the cable 40.

A cabinet closure 42 is illustrated as mounted to frame 10 and hinged to open providing access to electronic modules 12 and cable 40. Cabinet closure 42 is optional and would be used only where a totally enclosed appearance is desired. It provides no functional benefit.

Figure 3:
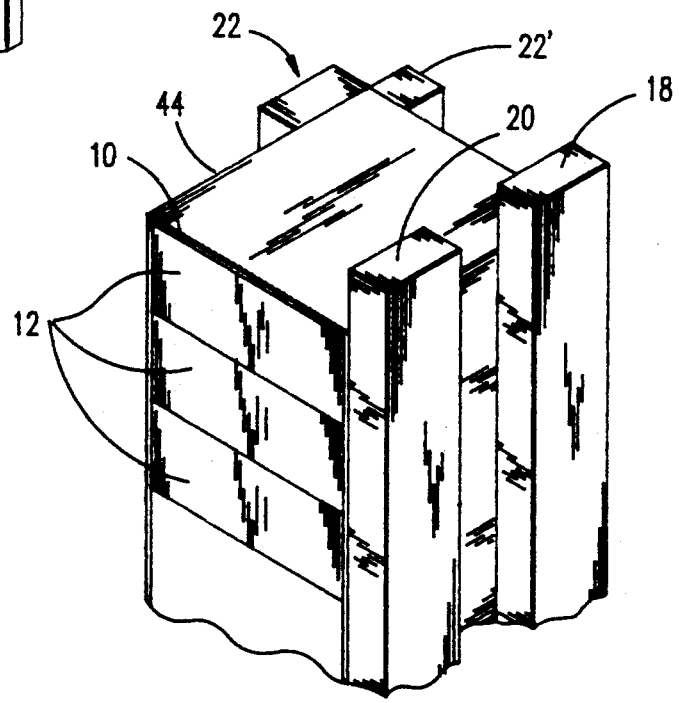
FIG. 3 is a perspective view of the frame and cabinet with the cable chase and cooling chase mounted on one side of the frame and cabinet and the power chase mounted on the rear or opposite side of the frame and cabinet for rear cabling convenience.

Referring now to FIG. 3, frame 10 and electronic modules 12 are illustrated having a cooling plenum 20 positioned adjacent the right side as far forward as possible and with a cable chase or plenum 18 positioned to the rear for management of the cables from the modules 12 having rear cabling.

With the arrangement of the cable plenum 18 positioned to manage rear cabling of modules 12, it may be desirable to provide the power plenum in either the position indicated by 22 or the position indicated by reference numeral 22'. It is not necessary to have both of the power plenums 22, 22' present as that would be redundant.

If the power plenum 22' occupies the position shown, then the left side panel 44 may then be abutted next to an adjacent side panel of an adjacent assembly 46, or an additional plenum assembly may be positioned intermediate the illustrated frame 10 and an adjacent frame (not shown).

Figure 4:
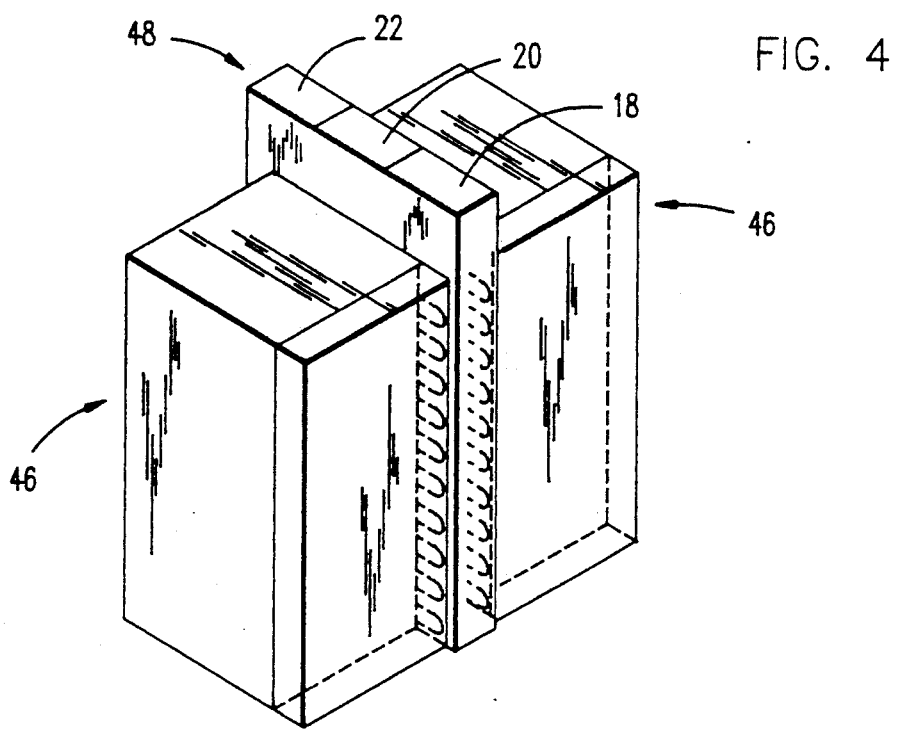
FIG. 4 illustrated plenums shared by adjacent frames and cabinets.

FIG. 4 illustrates two adjacent EIA frames 10 and assemblies 46 sharing a single plenum assembly 48. Assemblies 46 may beneficially access plenum assembly 48 from both sides, thus economizing on the number of plenum assemblies 48 necessary while at the same time providing easy interconnectability between adjacent assemblies 46.

Figure 5:
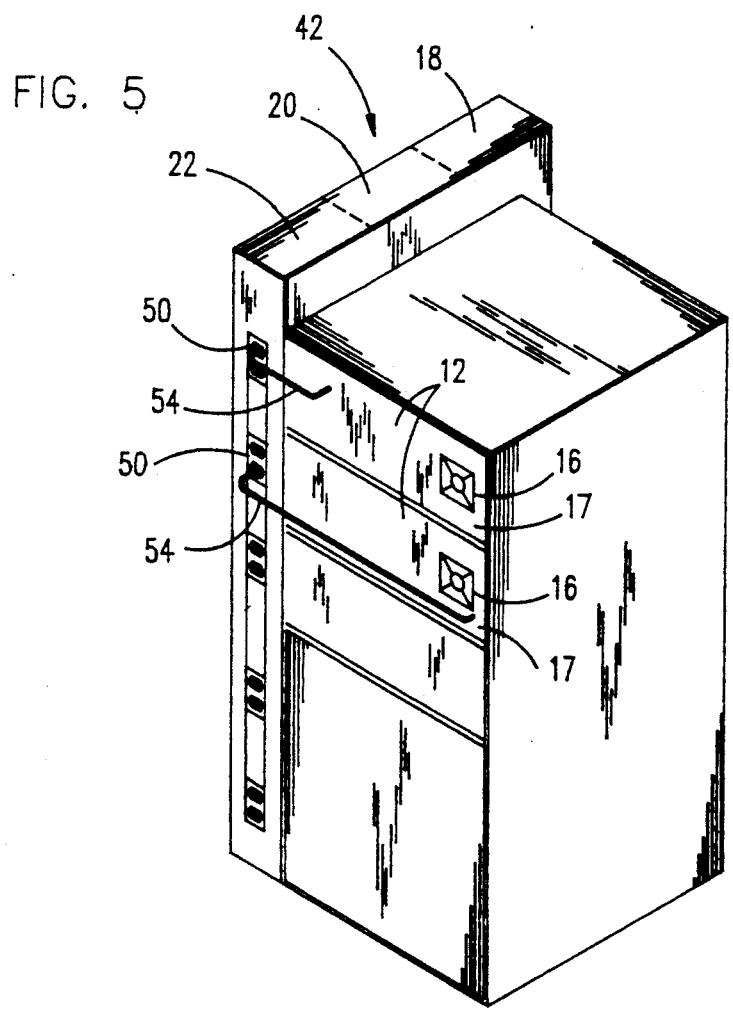
FIG. 5 is a right rear perspective of the frame and cabinet together with details of the power plenum.

FIG. 5 illustrates the arrangement of plenum assembly 48 in the same orientation as that found in FIGS. 1 and 2, but more clearly illustrates the power plenum 22 and particularly, the power outlets 50 in power plenum 22. Power cords 54 extending from the back face 17 of electronic modules 12 may be routed directly across to the power outlet 50. Power outlet 50 may be replaced with conventional multiple outlet power strips, not shown, which are conventional and which may further include power surge protection if desired.

Cooling fans 16 act to pull cooling air from cooling plenum 20 through the electronic modules 12 and exhaust the cooling air into the room atmosphere.

Inasmuch as the rear face 17 of the modules 12 typically are placed away from public view, it normally would be desirable to leave the rear faces open, thereby enhancing air circulation through cooling fans 16.

Figure 6:
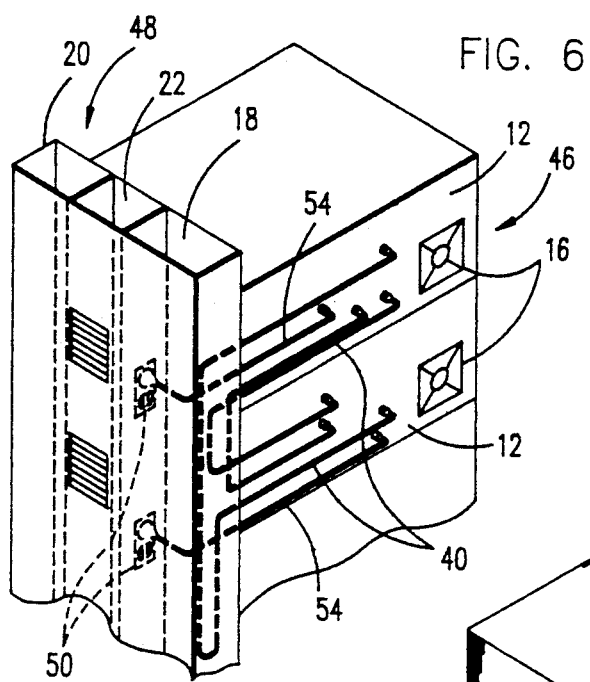
FIG. 6 illustrates a rear cabling arrangement with the power plenum positioned as the middle plenum of the plenum assembly while the cable management plenum is the rear plenum of the assembly.

Referring to FIG. 6, the plenum assembly 48 is illustrated in a rearranged form wherein the plenum assembly 48 will serve an assembly 46 having a rear cabling set-up. Cooling plenum 20 preferably is positioned most forwardly in this arrangement to provide the air flow to the most forward portion of modules 12 so that cooling fans 16 may pull the air through the greatest portion of electronic modules 12, without internal baffling within the module 12.

The position of power outlets 50 may be in the wall separating the power plenum 22 which is positioned centralmost of the plenum assembly 48, thus leaving cable plenum 18 to be readily available for the routing and management of cables 40 in the rear cabling set-up.

Power or line cords 54 extending from the rear face of electronic modules 12 will place a relatively small additional volumetric burden on the cable chase 18.

Figure 7:
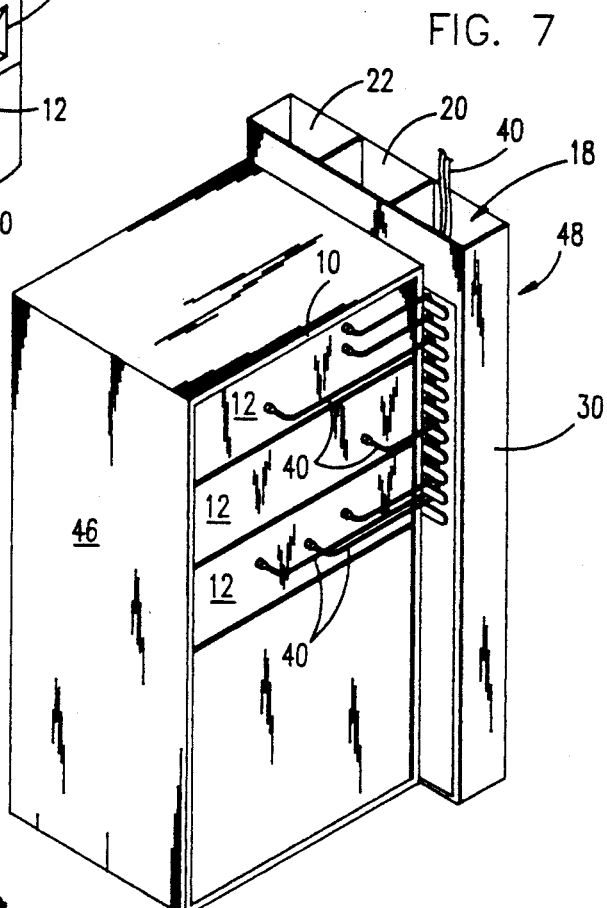
FIG. 7 illustrates a front cabling arrangement with the cable placement comb visible in the cable plenum with the cooling plenum being the center plenum and the power plenum being the rear plenum.

The plenum assembly 48 is illustrated in FIG. 7 extending above the frame 10 and assembly 46. This may be desirable in cases where the cables 40 entering the cable plenum 18 are entering from the ceiling. This is an arrangement which is particularly desirable when the cables 40 are fiber-optic cables, because it is often desirable to route fiber-optic cables separately from the conventional co-axial cables to protect them.

In the event cabling is directed into plenum 18 from beneath the supporting floor, then the top of plenum 18 may be closed and the height of the plenum need only be sufficiently high to accommodate cabling from the topmost module 12.

If chilled air is supplied for cooling purposes, the air flow may be introduced into cooling plenum 20 in any of the varying embodiments either from the top or bottom of the plenum 20 and the opposite end of the cooling plenum 20 should then be sealed to prevent undue escape of cooling air.

Further embodiments may involve the placement of the cooling plenum 20 and the cable plenum 18 on opposite sides of the EIA frame 10 and assembly 46, both near the front of the assembly 46 with adjacent assemblies 46 sharing either the cooling plenum 20 or the cable plenum 18, thus providing maximum cooling flow to the front portion of the modules 12 and providing maximum cable management for front cable modules 12.

Figure 8:
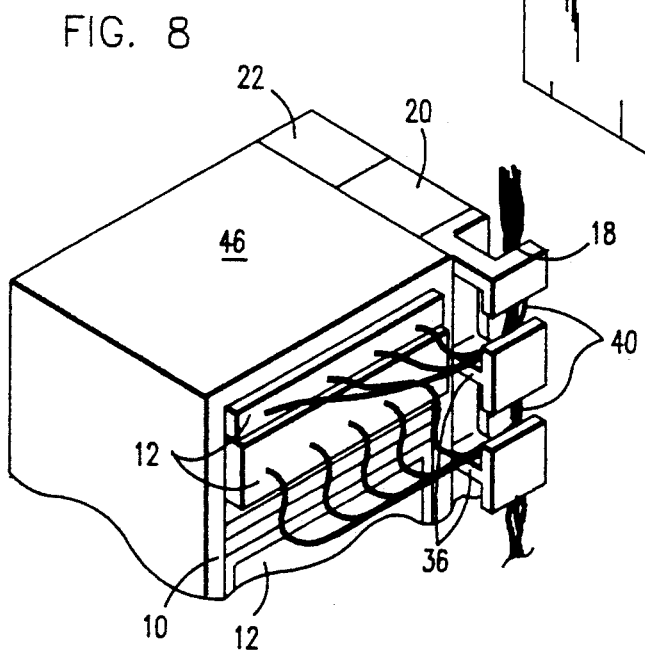
FIG. 8 illustrates a front cabling arrangement where the cable plenum is formed of a plurality of headed members supporting and containing the cables.

Referring to FIG. 8, the cable plenum 18 is illustrated as only partially enclosed by heads 36 which support cables 40 and retain the cables 40. The heads 36 define plenum 18 for the vertical routing of the cables 40. The remaining elements of FIG. 8 are the same as the like numbered elements of the other figures.

With the understanding that the cable plenum 18, cooling plenum 20 and power plenum 22 may be arranged in various locations on the sides of the frame 20, the invention we desire to protect by Letters Patent is set forth, in the attached claims.

We claim:

1. An electronic module packaging system for assembling and containing electronic modular components of an electronic system comprising:
    electronic modular components;
    a frame for receiving and supporting said electronic modular components, said frame having two vertical sides, a vertical front, a vertical back, a top and bottom;
    said frame open on at least one of said sides;
    a plurality of plenums comprising walls, disposed on one of said open sides and extending vertically along said sides;
    at least one of said plenums comprising at least an opening in at least one of said plenum walls to accommodate the ingress and egress of cables for connecting said modular components and for containing said cables in an orderly manner.

2. The electronic module packaging system of claim 1 wherein said system further comprises a second one of said plenums comprising means defining at least an opening through one of said walls, said opening proximate at least one of said modular components, thereby providing communication between said plenum and said at least one modular component for the passage of cooling air.

3. The electronic module packaging system of claim 2 wherein said system comprises a third one of said plenums;
    said third one of said plenums enclosing power distribution means for distributing utility power to a plurality of locations along said third one of said plenums;
    said third one of said plenums comprising means defining openings for providing passage of electrical power therethrough from said power distribution means to said modular components.

4. The electronic module packaging system of claim 3 wherein said openings receive electrical outlet fixtures, thereby providing an electrical power interconnection through said openings and between said power distribution means and said modular components.

5. The system of claim 1 wherein one of said walls is movable to provide access to said passage of one of said plenums.

6. The system of claim 2 wherein said second of said plenums defines at, at least one of its ends, an opening for the introduction of cooling air.

7. An electronic module housing for mounting and containing electronic modules having an interior and an exterior, comprising:
    a frame defining a front, back, and first and second sides extending from said frame front to said back for supporting and mounting electronic modules;
    means for defining a first vertical passage having a length, disposed exterior to said frame and extending along one of said first or second sides of said frame and connected to said frame and extending forward of said frame and communicating along said length of said passage with a region exterior to said frame and said region extending outwardly from said frame front to receive cables extending outwardly from the electronic modules and said frame front into said region.

8. An electronic module housing of claim 7 further comprising means for defining a second vertical passage on the exterior of said frame, said passage containing and supporting utilities electrical power distribution means.

9. An electronic module housing of claim 8 further comprising means for defining a third vertical passage on the exterior of said frame, said passage communicating along its length with one of said first or second sides of said frame to provide cooling air to the modules.

* * * * *